(12) United States Patent
Ju

(10) Patent No.: US 7,040,903 B2
(45) Date of Patent: May 9, 2006

(54) METHOD OF CONNECTING A CONTACT WITH A SOLDER AND AN ELECTRONIC DEVICE USING THE METHOD

(76) Inventor: Ted Ju, P.O. Box 26-757, Taipei 106 (TW)

( * ) Notice: Subject to any disclaimer, the term of this patent is extended or adjusted under 35 U.S.C. 154(b) by 0 days.

(21) Appl. No.: 10/876,874

(22) Filed: Jun. 23, 2004

(65) Prior Publication Data

US 2005/0287836 A1    Dec. 29, 2005

(51) Int. Cl.
*H01R 12/00* (2006.01)
*H05K 1/00* (2006.01)

(52) U.S. Cl. .............................. 439/71; 439/82; 439/83
(58) Field of Classification Search .................. 439/83, 439/82, 71; 29/884, 878

See application file for complete search history.

(56) References Cited

U.S. PATENT DOCUMENTS 5,896,655 A * 4/1999 Knodler ....................... 29/884
2004/0253852 A1* 12/2004 Regnier et al. ................ 439/83

* cited by examiner

*Primary Examiner*—Chandrika Prasad
(74) *Attorney, Agent, or Firm*—Rosenberg, Klein & Lee

(57) ABSTRACT

A method of connecting a contact with a solder includes to cling a solder to a contact or an insulative housing alternatively via an adhesive, and to heat the solder in order to weld the contact to a mating electronic device. And an electronic device using the method includes an insulative housing, a plurality of contacts received in the insulative housing, and a plurality of solders connect to the insulative housing and the contacts alternately via at least one adhesive arranged therebetween.

5 Claims, 5 Drawing Sheets

METHOD OF CONNECTING A CONTACT WITH A SOLDER AND AN ELECTRONIC DEVICE USING THE METHOD

BACKGROUND OF THE INVENTION

1. Field of the Invention

The present invention relates to a method of connecting a contact with a solder, and particularly relates to an electronic device using the method.

2. Background of the Invention

There are many kinds of electronic devices connect to a PCB in a BGA (Ball Grid Array) manner that is a SMT kind of connection methods, such as a CPU socket, a board-to-board connector, and etc. Each electronic device includes an insulative housing, a plurality of contacts received in the insulative housing, and a plurality of solders connecting the contacts respectively. The contacts should be welded with the solders respectively in advance in order to connect to the PCB. In a conventional method of assembling the electronic device, the contacts are inserted into the insulative housing prior to adhering the solders to the contacts, and the solders weld to connect the contacts when the electronic device with contacts received is heated by a first heating process. Several disadvantages of the electronic device processed with such a conventional method. First, a reflow oven should be adopted in the first heating process before the electronic device electrically connects the PCB via the contacts by a second heating process, thus the heating steps are so complicated to waste time that the yield rate will decrease and the costs will increase. Second, according to the first reason, some impurities in air in the oven may be happened to weld in the solder, so as to decrease the welding strength and the conductivity thereof; when the solders weld to the PCB in the second heating process, the solders may depart from the contacts, and the contacts fail to electrically connect the PCB well thereby.

Hence, an improvement over the prior art is required to overcome the disadvantages thereof.

SUMMARY OF INVENTION

The primary object of the invention is therefore to specify a method of connecting a contact with a solder and an electronic device using the method, which guarantee a perfect electric connection between the electronic device and a PCB.

According to the invention, the object is achieved by a method of connecting a contact with a solder. The method includes to cling a solder to a contact or an insulative housing alternatively via an adhesive, and to heat the solder in order to weld the contact to a mating electronic device.

According to the invention, the object is achieved by an electronic device using the method. The electronic device includes an insulative housing, a plurality of contacts received in the insulative housing, and a plurality of solders connect to the insulative housing and the contacts alternately via at least one adhesive arranged therebetween.

To provide a further understanding of the invention, the following detailed description illustrates embodiments and examples of the invention. Examples of the more important features of the invention thus have been summarized rather broadly in order that the detailed description thereof that follows may be better understood, and in order that the contributions to the art may be appreciated. There are, of course, additional features of the invention that will be described hereinafter and which will form the subject of the claims appended hereto.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE EMBODIMENTS

Figure 1:
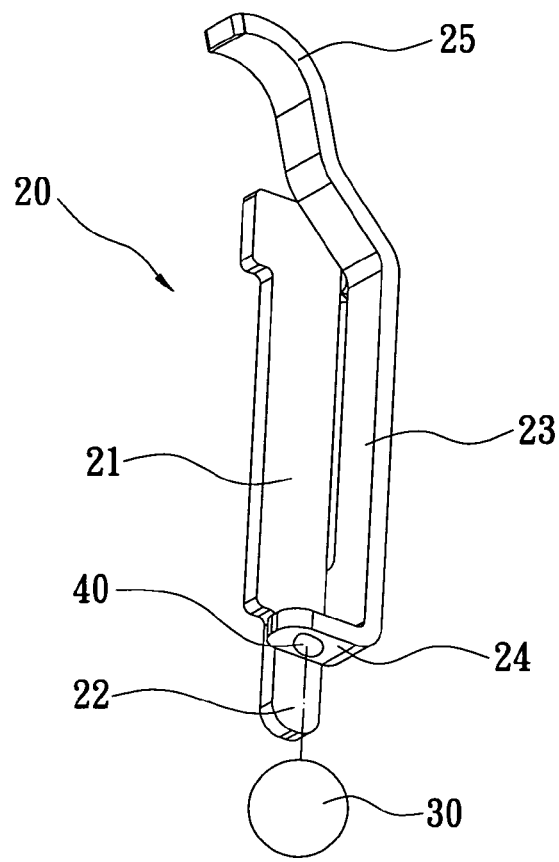
FIG. 1 is a perspective view of an electronic device according to a first embodiment of the present invention.
Figure 2:
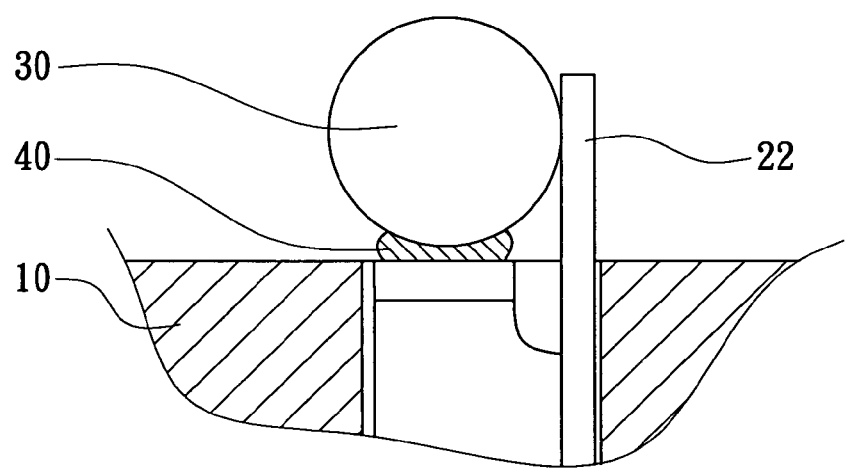
FIG. 2 is a cross-sectional profile of the electronic device according to the first embodiment of the present invention.
Figure 3:
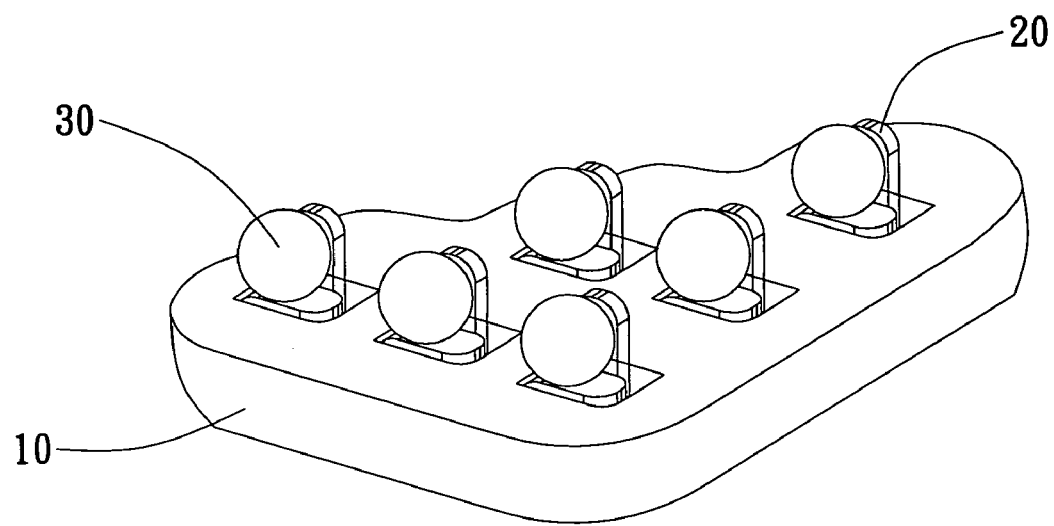
FIG. 3 is a perspective view of the electronic device according to the first embodiment of the present invention.

With respect to FIGS. 1 to 3, the present invention discloses an electronic device that includes an insulative housing 10, a plurality of contacts 20 receiving in the insulative housing 10, a plurality of solders 30 connect to the contacts 20 via a plurality of adhesives 40 arranged therebetween, respectively. The contacts 20 has an orientation portion 21 secured in the insulative housing 10, a soldering portion 22 extending downwardly from the orientation portion 21, and a resilient arm 23 extending laterally from the orientation portion 21. The resilient arm 23 has a connection end 24 folded horizontally from a lower end thereof to stick a respective one of the solders 30, and a contact end 25 resilient and bent from an upper end thereof to resiliently compress with a mating electronic device (not shown); wherein each of the adhesives 40 sticks to the soldering portion, as the solders 30 connect the contacts 20 respectively.

Figure 4:
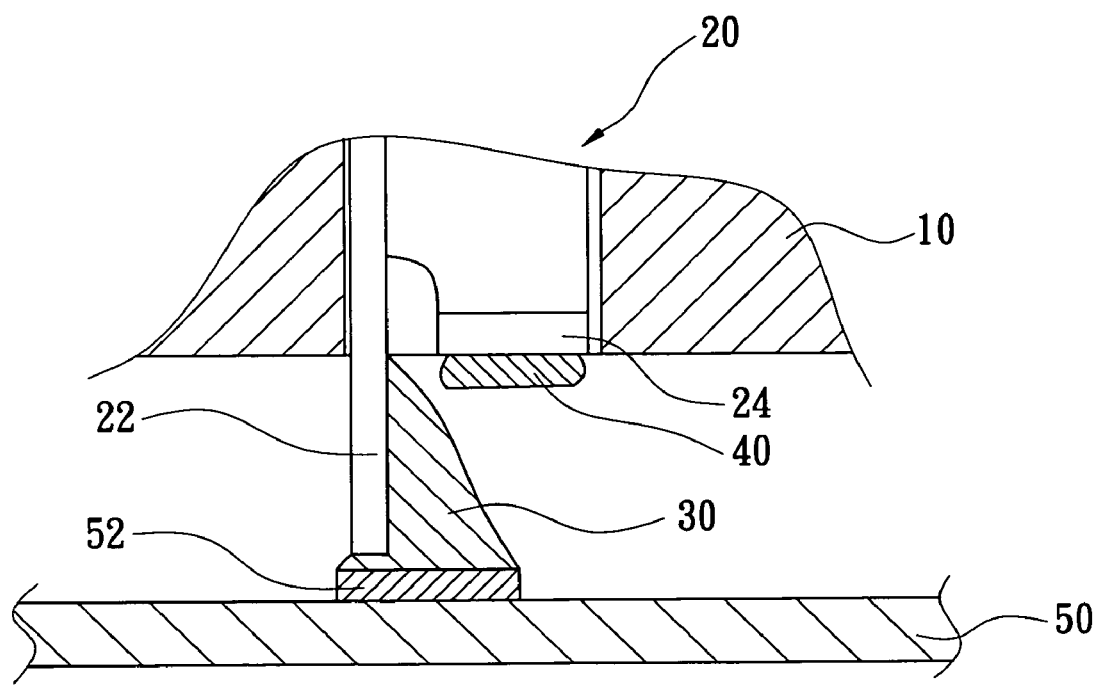
FIG. 4 is a perspective view of the electronic device according to the first embodiment of the present invention after welding.

In assembly, to spread (to drop or to paste) a layer of the adhesives 40 on the connection end 24 in advance. The adhesives 40 are made of nonconductive and conductive materials alternatively. To arrange the solders 30 on the adhesives 40 and to heat the adhesives 40 for hardening, so that each of the solders 40 connect the connection end 24 of the contacts 20 firmly and retain against the soldering portion 22 simultaneously. After a reflow process for a PCB 50 in FIG. 4, each of the solders 30 will weld and merge to connect the soldering portion 22 and a pad 52 of the PCB 50 simultaneously.

In comparison with the conventional method, the electronic device according to the present invention needs no pre-welding process for the contacts 20 and the solders 30, in order to simplify fabrication steps and further to avoid the solders 30 polluted in the pre-welding process. A perfect electrical connection between the electronic device and the PCB will be provided. The height of the adhesives 40 can be adjusted before the heating process to align each of the solders 30 with the soldering portion 22, so as to provide a smooth process thereby.

Figure 5:
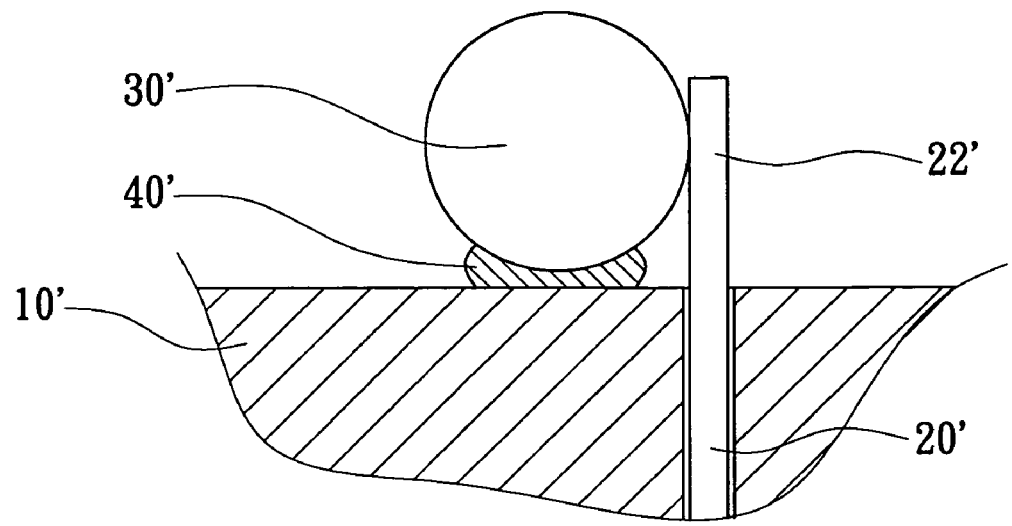
FIG. 5 is a cross-sectional profile of the electronic device according to a second embodiment of the present invention.
Figure 6:
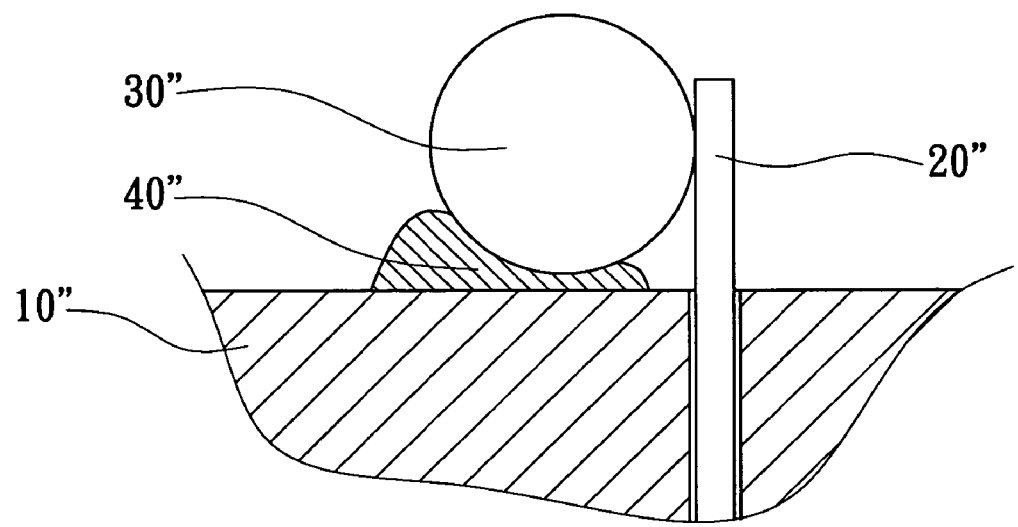
FIG. 6 is a cross-sectional profile of the electronic device according to a third embodiment of the present invention.

Referring to FIG. 5, pluralities of solders 30' can be stuck to an insulative housing 10' in an alternative manner. An adhesive 40' is stuck to the insulative housing 10' and adjacent to each of the contacts 20' in order to connect the solders 30'. Each of the solders 30' can be arranged over the adhesive 40' and abuts against a soldering portion 22' of each of the contacts 20'. FIG. 6 further shows a preferred embodiment of an adhesive 40" that has a first side thicker than a second side; additionally, the first side is remote from the each of the contacts 20", and the second opposes to the first side to be adjacent to the first side. When each solder 30" is melted to flow towards the contacts 20" in order to get a firm connection.

Figure 7:
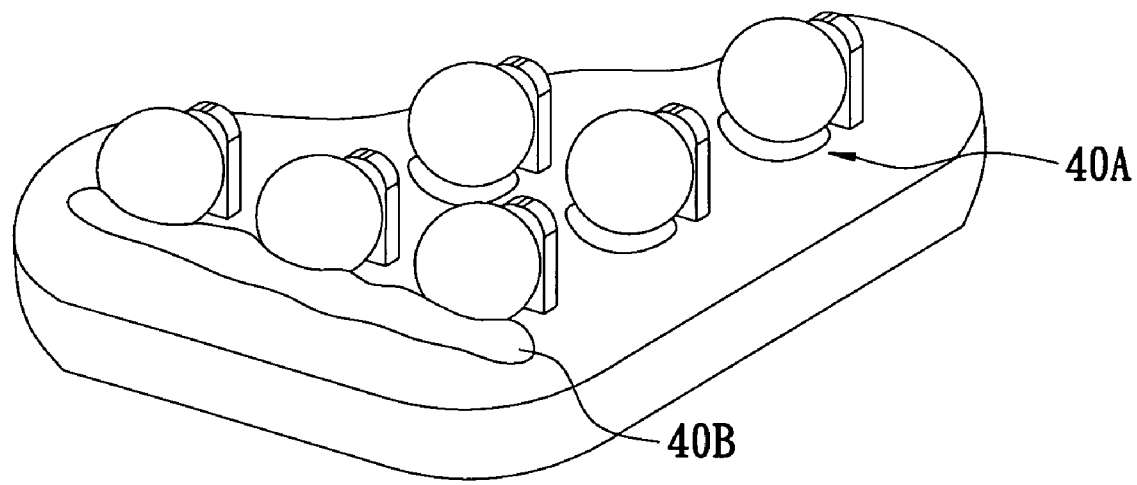
FIG. 7 is a cross-sectional profile of the electronic device according to a fourth embodiment of the present invention.

FIG. 7 illustrates the adhesive 40A can be arranged individually to correspond to each of the contacts. Alternatively, the adhesive 40B can be arranged in an elongated strip manner to correspond to the contacts simultaneously; so as to raise the manufacture efficiency in this embodiment.

Figure 8:
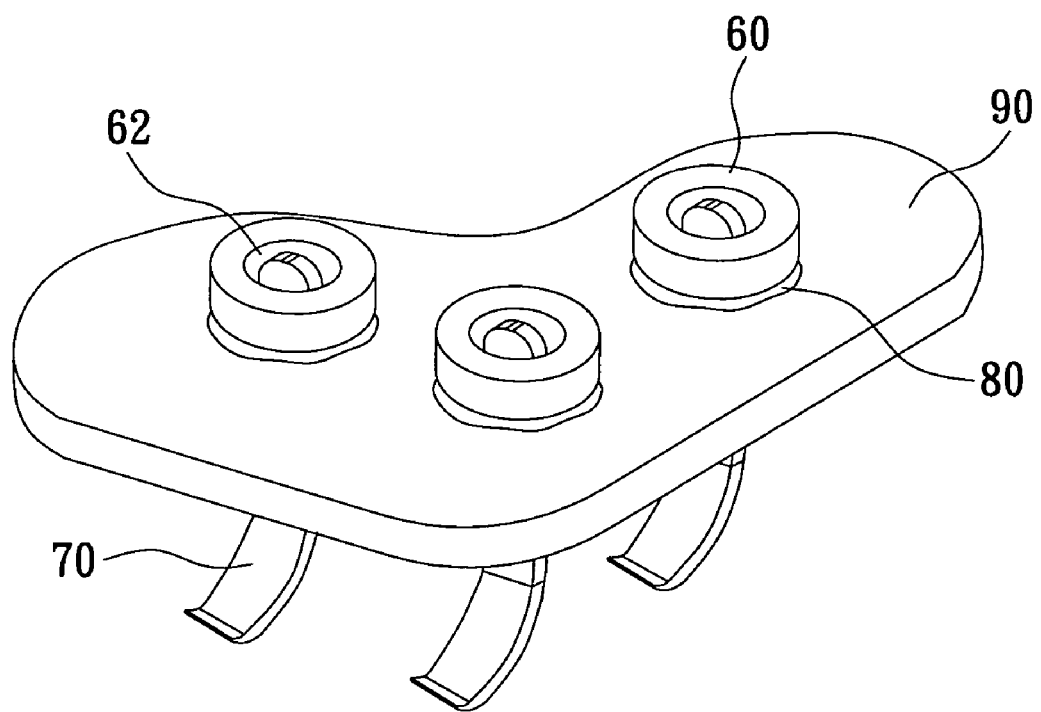
FIG. 8 is a cross-sectional profile of the electronic device according to a fifth embodiment of the present invention.

For a common sense, the solders may not contact the contacts, they only are adjacent to the contacts, before a reflow process. When the electronic relates to the PCB in the reflow process, electronic components are usually dragged by the solders and toward the PCB to exclude part of the solders, so that the solders move outwardly to contact the contacts. A socket, a chip module or other electronic members, probably can exchange the PCB. In addition, the solders can be in ball shapes, pillar shapes, donut shapes or the like. FIG. 8 shows a donut solder 60 having a hole 62 formed on a center thereof, a contact 70 penetrate through the hole 62, and the donut solder 60 connect an insulative housing 90 via as adhesive 80.

Figure 9:
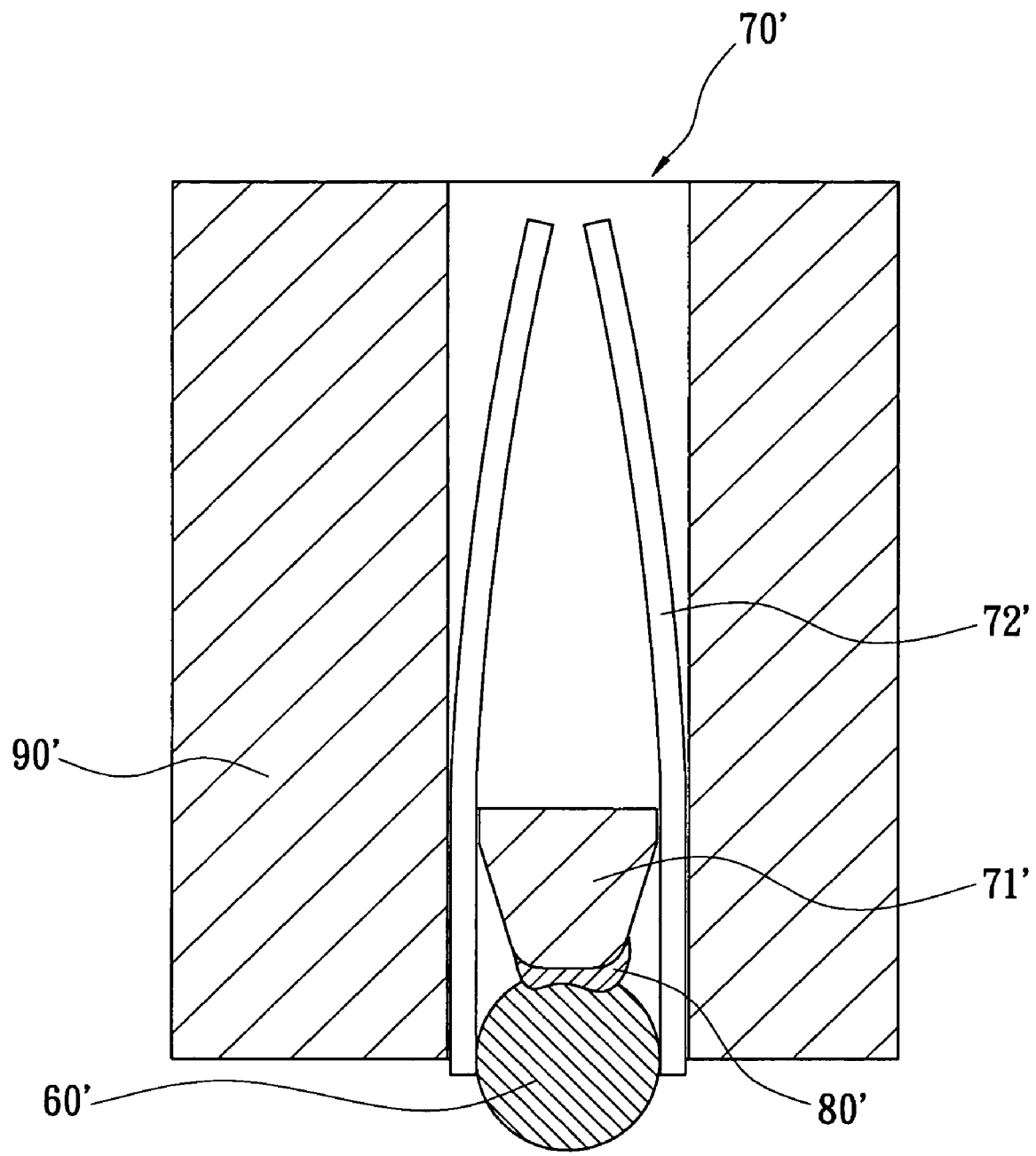
FIG. 9 is a cross-sectional profile of the electronic device according to a sixth embodiment of the present invention.

Referring to FIG. 9, another embodiment of the contact, the contact 70' includes a base 71' arranged at a lower portion in the insulative housing 90', and two resilient arms 72' opposite to each other and connecting two lateral sides of the base 71'; wherein the two resilient arms 72' abut against two lateral internal surfaces in the insulative housing 90', respectively; a respective one of the solders 60' sticks to the base 71' of the contact 70' via the adhesive 80' and is sandwiched by the two resilient arms 72' of the contact 70'.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A method of connecting a contact with a solder, wherein the contact is secured in an insulative housing, and the method comprising:
    (1) clinging a solder to the insulative housing via an adhesive, the solder being adjacent to the contact, wherein said adhesive includes a conductive material; and
    (2) heating the solder in order to weld the contact to a mating electronic device.

2. The method as claimed in claim 1, wherein the contact includes a soldering portion exposed outside the insulative housing, the soldering portion being in contact with the solder.

3. The method as claimed in claim 1, wherein a plurality of said contacts are secured in said insulating housing, and wherein the adhesive is arranged to form a plurality of adhesive portions, each adhesive portion individually corresponding to a respective one of said plurality of the contacts.

4. An electronic device comprising:
    an insulative housing;
    a plurality of contacts received in the insulative housing; and
    a plurality of solders, each of said plurality of solders being connected to a respective one of said plurality of the contacts via at least one adhesive arranged between said each solder and said insulative housing, said adhesive including a conductive material.

5. The electronic device as claimed in claim 4, wherein the adhesive is arranged to form a plurality of adhesive portions, each adhesive portion individually corresponding to each of said plurality of the contacts.

* * * * *